United States Patent
Wu et al.

(10) Patent No.: US 7,834,699 B1
(45) Date of Patent: Nov. 16, 2010

(54) AUDIO COMPENSATION METHOD AND AUDIO APPARATUS WITH CLASS AB POWER AMPLIFIER

(75) Inventors: Li-Te Wu, Taipei (TW); Min-Yung Shih, Hsinchu (TW)

(73) Assignee: Fortemedia, Inc., Cupertino, CA (US)

( * ) Notice: Subject to any disclaimer, the term of this patent is extended or adjusted under 35 U.S.C. 154(b) by 0 days.

(21) Appl. No.: 12/469,005

(22) Filed: May 20, 2009

(51) Int. Cl.
*H03F 3/26* (2006.01)
(52) U.S. Cl. .................................. 330/267; 330/253
(58) Field of Classification Search .............. 330/253, 330/51, 98–99, 255, 267
See application file for complete search history.

(56) References Cited

U.S. PATENT DOCUMENTS 5,621,353 A * 4/1997 Botti et al. ..................... 330/51
6,549,044 B2 * 4/2003 Brambilla et al. ........... 327/110

* cited by examiner

*Primary Examiner*—Hieu P Nguyen
(74) *Attorney, Agent, or Firm*—Thomas, Kayden, Horstemeyer & Risley

(57) ABSTRACT

An audio apparatus is provided, receiving a reference voltage and an input signal to generate an output signal. In the audio apparatus, a compensation circuit, generates a compensated reference voltage based on the input signal, the reference voltage and the output signal. A class AB power amplifier receives the compensated reference voltage to amplify the input signal into the output signal.

9 Claims, 3 Drawing Sheets

AUDIO COMPENSATION METHOD AND AUDIO APPARATUS WITH CLASS AB POWER AMPLIFIER

BACKGROUND OF THE INVENTION

1. Field of the Invention

The invention relates to an audio power amplifier, and in particular, to an audio compensation method implemented in a class AB power amplifier for distortion compensation.

2. Description of the Related Art

FIG. 1a shows a conventional audio device with a class AB power amplifier. In the audio device 100, a class AB power amplifier 110 receives a reference voltage $V_{ref}$ and an input signal $V_{IN}$ to output an output signal $V_{OUT}$. A capacitor 102 is coupled to the output signal $V_{OUT}$ for playing the sound. A capacitor 102 is deposited between the class AB power amplifier 110 and the speaker 120, for separating DC bias voltages between the class AB power amplifier 110 and the speaker 120.

As known, the class AB power amplifier 110 has poor linearity characteristics. In practical implementation, the open-loop gain of the class AB power amplifier 110 varies significantly and is a function of the output signal $V_{OUT}$. Consequently, it introduces severe distortion to the output playback signal.

FIG. 1b shows the symptom of distortion according to FIG. 1a. The waveform of the real output $S_{out}$ significantly differs from the ideal output waveform especially near to the mid-rail, which is a so-called cross-over distortion. Since linearity is an important feature for audio applications, a class AB power amplifier 110 of poor linearity degrades audio quality. Thus, it is desirable to develop a class AB power amplifier with better linearity for improved audio quality.

BRIEF SUMMARY OF THE INVENTION

An audio compensation method is implemented. A compensation circuit receives a reference voltage and an input signal. The compensation circuit generates a compensated reference voltage based on the input signal, the reference voltage and the output signal. The class AB power amplifier amplifies the input signal into the output signal based on the compensated reference voltage.

An exemplary embodiment of an audio apparatus is provided, receiving a reference voltage and an input signal to generate an output signal. In the audio apparatus, a compensation circuit generates a compensated reference voltage based on the input signal, the reference voltage and the output signal. A class AB power amplifier receives the compensated reference voltage to amplify the input signal into the output signal.

In the compensation circuit, a first operational amplifier has a first positive input end for receiving the reference voltage, a first negative input end and a first output end. A first resistance device is coupled to the first negative input end for receiving the output signal. A second resistance device is coupled to the first negative input end for receiving the input signal. A third resistance device is couple to the first negative input end and the first output end. The compensated reference voltage is output via the first output end.

In the class AB power amplifier, a third output end is presented to output the output signal. A second operational amplifier has a second positive input end coupled to the compensated reference voltage, a second negative input end and a second output end coupled to the third output end. A fourth resistance device is coupled to the second negative input end for receiving the input signal. A fifth resistance device is coupled to the second negative input end and the third output end.

Preferably, the ratio of the second resistance device and the first resistance device is identical to the ratio of the fifth resistance device and the fourth resistance device.

Furthermore, in the class AB power amplifier, a PMOS has a source coupled to a supply voltage and, a drain coupled to the third output end. A PMOS driver is coupled to a gate of the PMOS and the second output end to drive the PMOS based on an output from the second operational amplifier. An NMOS has a source coupled to the third output end, and a drain coupled to a voltage ground. An NMOS driver is coupled to a gate of the NMOS and the second output end to drive the NMOS based on the output from the second operational amplifier.

The audio apparatus may further comprise a speaker coupled to the class AB power amplifier for playing the output signal. A capacitor is coupled between the class AB power amplifier and the speaker to isolate DC signals of the class AB power amplifier from the speaker. A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
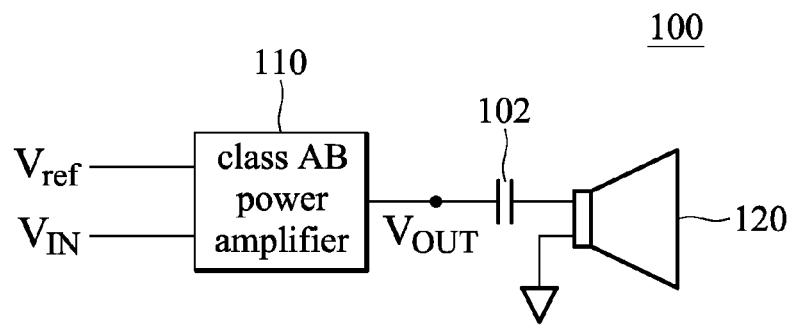
FIG. 1a shows a conventional audio device with a class AB power amplifier.
Figure 1B:
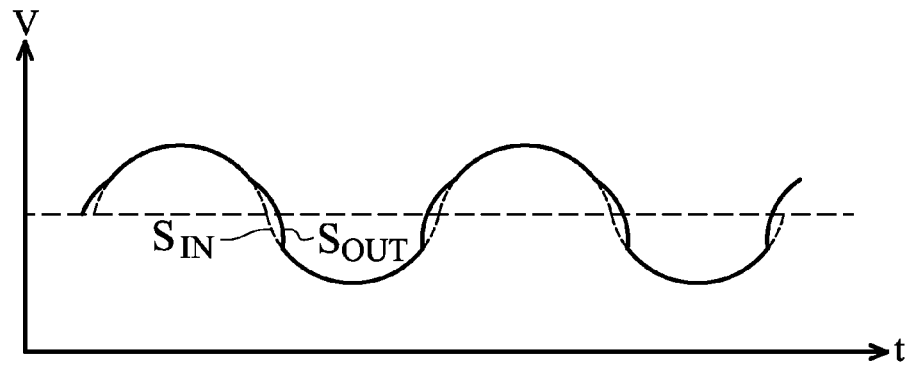
FIG. 1b shows the symptom of cross-over distortion based on the conventional class AB power amplifier.
Figure 2:
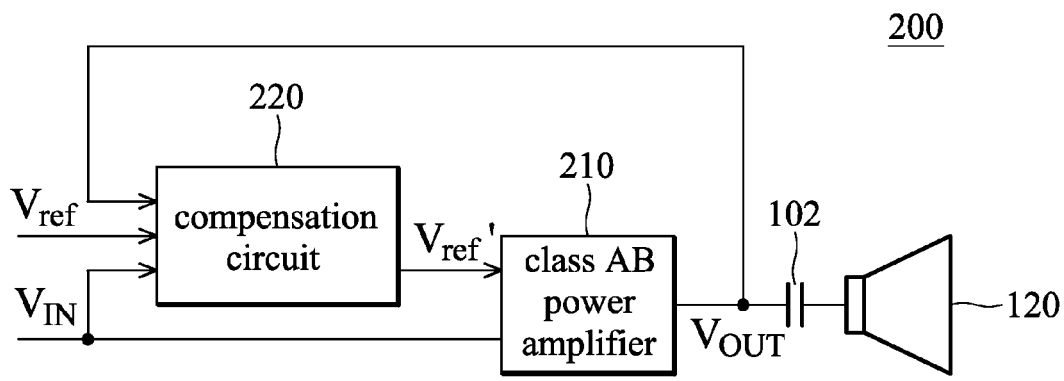
FIG. 2 shows an embodiment of an audio device with distortion compensation.

FIG. 2 shows an embodiment of an audio device with distortion compensation. Since the output signal $V_{OUT}$ is distorted, the output signal $V_{OUT}$ is fed back to estimate an error between the input signal $V_{IN}$ and the output signal $V_{OUT}$. The estimated error is employed to modify the reference voltage $V_{ref}$ into a compensated reference voltage $V_{ref}'$. The compensated reference voltage $V_{ref}'$ is then used instead of the reference voltage $V_{ref}$, such that the distortion in the output signal $V_{OUT}$ can be corrected. The audio device 200 shown in FIG. 2 essentially comprises a class AB power amplifier 210 and a compensation circuit 220. The compensation circuit 220 receives three parameters, the input signal $V_{IN}$, the reference voltage $V_{ref}$ and the output signal $V_{OUT}$ to generate the compensated reference voltage $V_{ref}'$. The class AB power amplifier 210 coupled to the compensation circuit 220 then employs the compensated reference voltage $V_{ref}'$ to amplify the input signal $V_{IN}$ into the output signal $V_{OUT}$.

Preferably, the audio device 200 further comprises a speaker 120 coupled to the class AB power amplifier 210 for playing the output signal $V_{OUT}$. A capacitor 102 is generally provided, coupled between the class AB power amplifier 210 and the speaker 120 to isolate DC signals of the class AB power amplifier 210 from the speaker 120.

Figure 3:
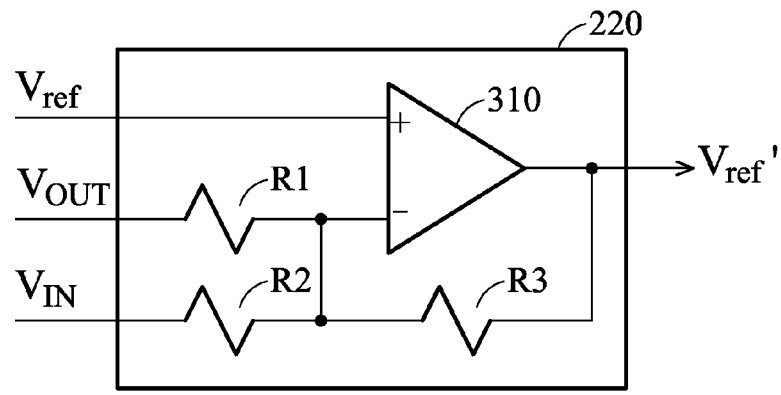
FIG. 3 shows an embodiment of the compensation circuit 220 according to FIG. 2.

FIG. 3 shows an embodiment of the compensation circuit 220 according to FIG. 2. The compensation circuit 220 essentially comprises a first operational amplifier 310 and three resistors. The first operational amplifier 310 has a first positive input end for receiving the reference voltage $V_{ref}$, a first negative input end and a first output end. A first resistor R1 is coupled between the first negative input end and the output signal $V_{OUT}$. A second resistor R2 is coupled between the first negative input end and the input signal $V_{IN}$. A third resistor R3 is coupled between the first negative input end and the first output end. The first output end is where the compensated reference voltage $V_{ref}'$ is output.

Figure 4:
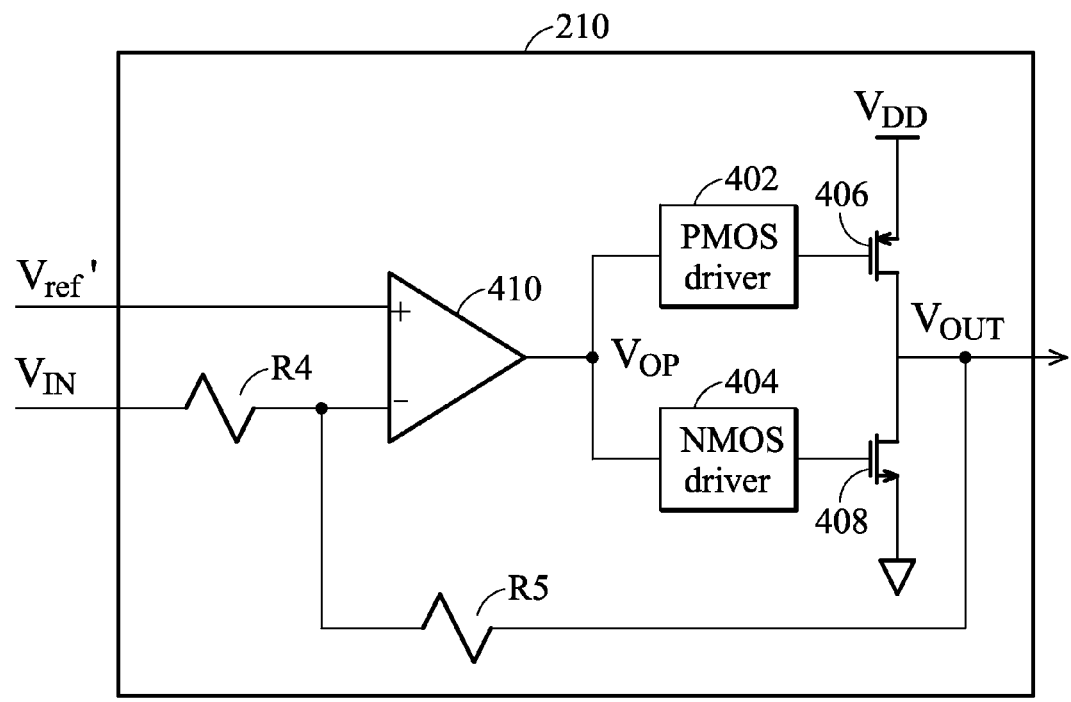
FIG. 4 shows an embodiment of the class AB power amplifier 210 according to FIG. 2.

FIG. 4 shows an embodiment of the class AB power amplifier 210 according to FIG. 2. The class AB power amplifier 210 typically comprises a third output end from where the output signal $V_{OUT}$ is output. A second operational amplifier 410 is employed inside the class AB power amplifier 210, having a second positive input end coupled to the compensated reference voltage $V_{ref}'$, and a second negative input end and a second output end coupled to the third output end. A fourth resistor R4 is coupled between the second negative input end and the input signal $V_{IN}$. Meanwhile, a fifth resistor R5 is coupled between the second negative input end and the third output end.

Specifically, the class AB power amplifier 210 further comprises a PMOS 406 and an NMOS 408 cascaded in series to serve as a driving stage. The PMOS 406 has a source coupled to a supply voltage VDD, a drain coupled to the third output end, and a gate coupled to a PMOS driver 402. The PMOS driver 402 drives the PMOS 406 based on an output from the second operational amplifier 410. For the lower part of FIG. 4, an NMOS 408 has a source coupled to the third output end, a drain coupled to a voltage ground, and a gate driven by an NMOS driver 404 based on the output from the second operational amplifier 410.

Before further discussion, following are defined parameters:

$$n = R_5/R_4 \quad (1);$$

$$r = R_3/R_1 \quad (2); \text{ and}$$

$$s = R_3/R_2 \quad (3).$$

The output signal $V_{OUT}$ is a function of the $V_{IN}$ denoted as:

$$V_{OUT} = -\frac{G}{1+X}V_{IN}, \quad (4)$$

where $$G = n, \quad X = \frac{(n+1)}{A(V_{out}, f)},$$

G is the gain between input signal $V_{IN}$ and output signal $V_{OUT}$, and A denotes the gain provided by the second operational amplifier 410. X is employed to represent a non-ideal factor dependent upon frequency f and the output signal $V_{OUT}$. If X=0, the audio device 200 is a linear system. If X is not zero and A is independent from the output signal $V_{OUT}$, and a gain error may be induced while the waveform of the output signal $V_{OUT}$ is maintained at a linear state. Practically, the gain A is dependent on the output signal $V_{OUT}$ and thus a nonlinear distortion is unavoidably introduced. Following shows the relationship between the distortion and the non-ideal factor:

$$\text{Distortion} \propto \frac{|X_{max}| - |X_{min}|}{|X_{max}| \cdot |X_{min}|}. \quad (5)$$

To improve linearity, one can either minimize the mismatch between $|X_{max}|$ and $|X_{min}|$ or to increase the value of X.

When the compensation circuit 220 is employed in the audio device 200, a relationship between the input signal $V_{IN}$ and output signal $V_{OUT}$ is represented with an equivalent gain G", shown as follows:

$$V_{OUT}'' = -\frac{G''}{1+X''}V_{IN}, \text{ where}: G'' = \frac{n + r(n+1)}{1 + s(n+1)}, \text{ and} \quad (6)$$

$$X'' = \frac{1}{(1+sn+s)} \cdot X = \frac{1}{(1+sn+s)} \cdot \frac{(n+1)}{A(V_{OUT}, f)}. \quad (7)$$

Based on the equation (6), the equivalent gain G" is equal to G if and only if: sn=r. To satisfy sn=r, the ratio of the second resistor R2 and the first resistor R1 should be identical to that of the fifth resistor R5 and the fourth resistor R4. In such case, G"=G=n. The non-ideal factor X" is minimized by the factor of (1+sn+s). For example, preferable resistor values are: for the fourth resistor R4=20 k, for the fifth resistor R5=20 k, for the third resistor R3=audio device 200 k, for the first resistor R1=20 k, and for the second resistor R2=20 k.

In conclusion, the linearity of a class AB audio power amplifier is poor due to cross-over distortion. Linearity improvement can be made by increasing the quiescent current flowing through the PMOS 406 and the NMOS 408. This approach, however, would increase power consumption. If the total harmonic distortion (THD) is designated to increase 26 dB, the quiescent current has to increase from 1 mA to 25 mA, which is a significant cost. The embodiment improves linearity by using a compensation circuit 220. Although the class AB power amplifier 210 is nonlinear, the first operational amplifier 310 in the compensation circuit 220 is a linear operational amplifier. This can be easily implemented because that the output loading of the first operational amplifier 310 is in the order of 10 k~audio device 100 k and the output stage of the first operational amplifier 310 is biased under the saturation region for most of the output swing. The additional current consumption is about 0.1 mA (for improving THD to 26 dB), which is most useful than increasing the quiescent of the class AB power amplifier 110 directly.

Figure 5:
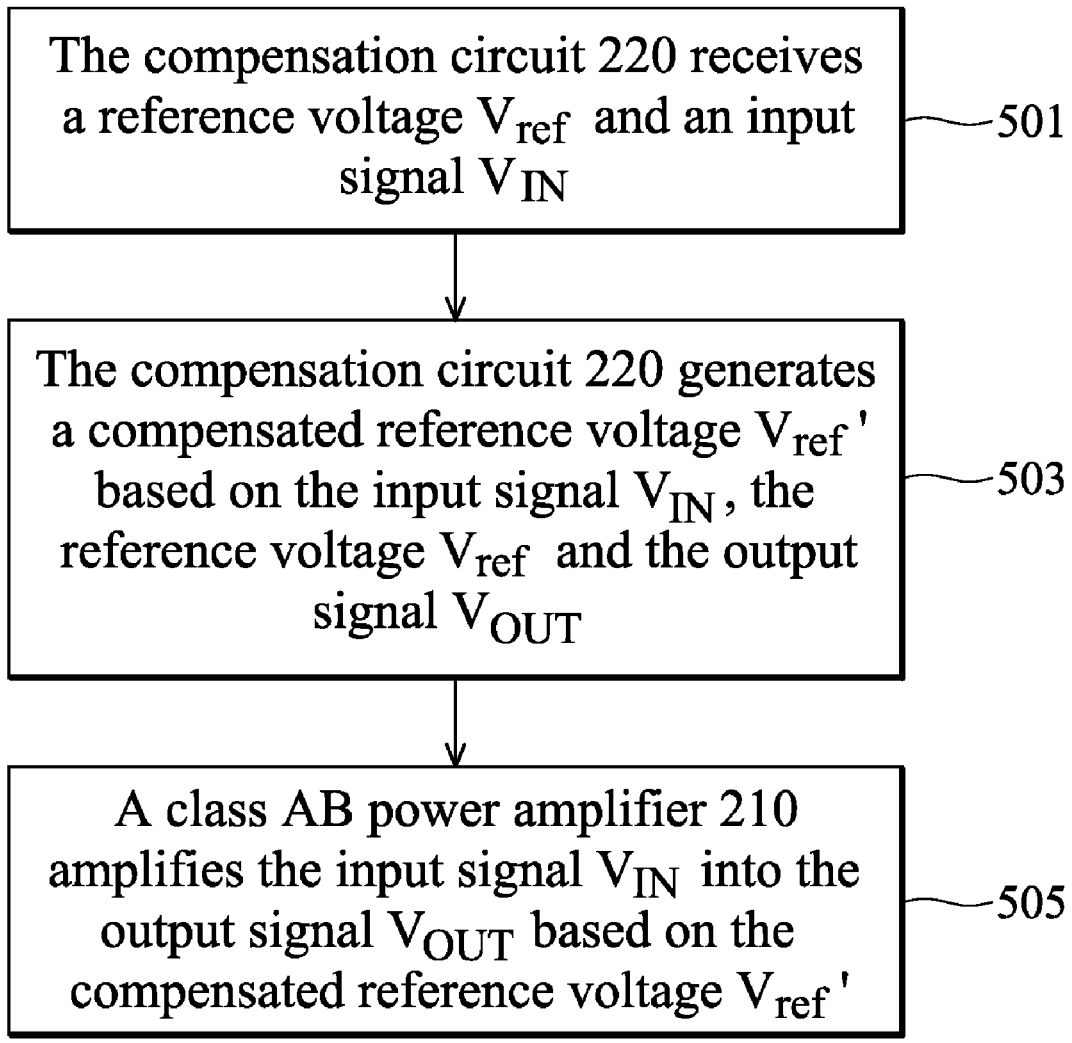
FIG. 5 is a flowchart of the audio compensation method implemented in the embodiment of FIG. 2.

FIG. 5 is a flowchart of the audio compensation method implemented in the embodiment of FIG. 2. The operation performed in the aforementioned circuits can be summarized into the following steps. In step 501, the compensation circuit 220 receives a reference voltage $V_{ref}$ and an input signal $V_{IN}$. In step 503, the compensation circuit 220 generates a compensated reference voltage $V_{ref}'$ based on the input signal $V_{IN}$, the reference voltage $V_{ref}$ and the output signal $V_{OUT}$. In step 505, a class AB power amplifier 210 amplifies the input signal $V_{IN}$ into the output signal $V_{OUT}$ based on the compensated reference voltage $V_{ref}'$.

While the invention has been described by way of example and in terms of preferred embodiment, it is to be understood that the invention is not limited thereto. To the contrary, it is intended to cover various modifications and similar arrangements (as is apparent to those skilled in the art). Therefore, the scope of the appended claims should be accorded the broadest interpretation so as to encompass all such modifications and similar arrangements.

What is claimed is:

1. An audio amplification method, comprising:
   receiving a reference voltage and an input signal;
   generating a compensated reference voltage based on the input signal, the reference voltage and the output signal; and
   providing a class AB power amplifier to amplify the input signal into the output signal based on the compensated reference voltage, wherein generation of the compensated reference voltage comprises:
   providing a first operational amplifier, having a first positive input end, a first negative input end and a first output end;
   the first positive end receiving the reference voltage;
   the first negative input end receiving the output signal via a first resistance device, and the input signal via a second resistance device; and
   coupling the first ouput end to the first negative input end via a third resistance device, wherein the class AB power amplifier comprises a third output end and amplification performed by the class AB power amplifier comprises:
   providing a second operational amplifier having a second positive input end, a second negative input and a second output end coupled to the third output end;
   the second positive input end receiving the compensated reference voltage;
   the second negative input end receiving the input signal via a fourth resistance device;
   the third output via coupling to the second negative input end via a fifth resistance device; and
   the third output ending outputting the output signal.

2. The audio compensation method as claimed in claim 1, wherein the ratio of the second resistance device and the first resistance device is identical to the ratio of the fifth resistance device and the fourth resistance device.

3. The audio compensation method as claimed in claim 1, further comprising broadcasting the output signal by a speaker coupled to the class AB power amplifier.

4. The audio compensation method as claimed in claim 3, further comprising isolating DC signals of the class AB power amplifier from the speaker by a capacitor.

5. An audio apparatus, receiving a reference voltage and an input signal to generate an output signal, comprising:
   a compensation circuit, generating a compensated reference voltage based on the input signal, the reference voltage and the output signal, wherein the compensation circuit comprises:
   a first operational amplifier, having a first positive input end for receiving the reference voltage, a first negative input end and a first output end;
   a first resistance device, coupled to the first negative input end for receiving the output signal;
   a second resistance device, coupled to the first negative input end for receiving the input signal; and
   a third resistance device, couple to the first negative input end and the first output end; wherein the compensated reference voltage is output via the first output end; and
   a class AB power amplifier, receiving the compensated reference voltage to amplify the input signal into the output signal, wherein the class AB power amplifier comprises:
   a third output end for outputting the output signal;
   a second operational amplifier, having a second positive input end coupled to the compensated reference voltage, a second negative input and a second output end coupled to the third output end;
   a fourth resistance device, coupled to the second negative input end for receiving the input signal; and
   a fifth resistance device, coupled to the second negative input end and the third output end.

6. The audio apparatus as claimed in claim 5, wherein the ratio of the second resistance device and the first resistance device is identical to the ratio of the fifth resistance device and the fourth resistance device.

7. The audio apparatus as claimed in claim 5, wherein the class AB power amplifier further comprises:
   a PMOS, having a source coupled to a supply voltage, a drain coupled to the third output end;
   a PMOS driver, coupled to a gate of the PMOS and the second output end to drive the PMOS based on an output from the second operational amplifier;
   an NMOS, having a source coupled to the third output end, a drain coupled to a voltage ground; and
   an NMOS driver, couple to a gate of the NMOS and the second output end to drive the NMOS based on the output from the second operational amplifier.

8. The audio apparatus as claimed in claim 5, further comprising a speaker, coupled to the class AB power amplifier to play the output signal.

9. The audio apparatus as claimed in claim 5, further comprising a capacitor, coupled between the class AB power amplifier and the speaker to isolate DC signals of the class AB power amplifier from the speaker.

* * * * *